(12) United States Patent
Ellis et al.

(10) Patent No.: US 7,313,032 B2
(45) Date of Patent: Dec. 25, 2007

(54) SRAM VOLTAGE CONTROL FOR IMPROVED OPERATIONAL MARGINS

(75) Inventors: Wayne F. Ellis, Jericho, VT (US); Randy W. Mann, Poughquag, NY (US); David J. Wager, Jericho, VT (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,556

(22) Filed: Nov. 29, 2005

(65) Prior Publication Data
US 2007/0121370 A1 May 31, 2007

(51) Int. Cl.
*G11C 5/14* (2006.01)
*G11C 11/00* (2006.01)

(52) U.S. Cl. .................. 365/189.09; 365/156
(58) Field of Classification Search ............ 365/189.09
See application file for complete search history.

(56) References Cited

U.S. PATENT DOCUMENTS

| | | | | |
|---|---|---|---|---|
| 5,715,191 A | * | 2/1998 | Yamauchi et al. ......... | 365/156 |
| 5,757,702 A | * | 5/1998 | Iwata et al. ............. | 365/189.05 |
| 6,205,049 B1 | * | 3/2001 | Lien et al. .................. | 365/154 |
| 6,549,453 B2 | * | 4/2003 | Wong ......................... | 365/156 |
| 6,654,277 B1 | * | 11/2003 | Hsu et al. ................... | 365/154 |
| 6,795,332 B2 | * | 9/2004 | Yamaoka et al. .......... | 365/154 |
| 6,925,025 B2 | * | 8/2005 | Deng et al. ................. | 365/226 |
| 6,990,035 B2 | * | 1/2006 | Redwine et al. ........... | 365/227 |
| 7,023,722 B2 | * | 4/2006 | Kanehara et al. .......... | 365/154 |
| 7,055,007 B2 | * | 5/2006 | Flautner et al. ............. | 711/156 |
| 2005/0068824 A1 | * | 3/2005 | Houmura et al. .......... | 365/202 |

* cited by examiner

*Primary Examiner*—Son L. Mai
(74) *Attorney, Agent, or Firm*—Daryl K. Neff, Esq.; Joseph P. Abate, Esq.

(57) ABSTRACT

A static random access memory ("SRAM") is provided which includes a plurality of SRAM cells arranged in an array. The array includes a plurality of rows and a plurality of columns. The SRAM includes a plurality of voltage control corresponding to respective ones of the plurality of columns of the array. Each of the plurality of voltage control circuits are coupled to an output of a power supply, each voltage control circuit having a function to temporarily reduce a voltage provided to power supply inputs of a plurality of SRAM cells that belong to a selected column of columns of the SRAM. The selected column is selected and the power supply voltage to that column is reduced during a write operation in which a bit is written to one of the SRAM cells belonging to the selected column.

15 Claims, 4 Drawing Sheets

SRAM VOLTAGE CONTROL FOR IMPROVED OPERATIONAL MARGINS

BACKGROUND OF THE INVENTION

The present invention relates to static random access memories ("SRAMs"), and more particularly to SRAMs having circuits for altering a voltage level supplied thereto. In addition, aspects of the invention relate to methods of operating an SRAM in which a voltage level supplied thereto is altered.

SRAMs are uniquely suited to the functions they serve within processors and other devices for storage of data to which fast (low cycle time) and ready (low latency) access is desired. Certain types of storage within processors are almost always implemented using SRAMs, such as cache memories, control stores, buffer memories, instruction pipelines and data pipelines including input output interfaces and buffers for direct memory access ("DMA") interfaces. In addition, certain storage used for communication interfaces, e.g., network adapter buffers and so on, also utilize SRAMs for speed and low latency. Since SRAMs are frequently incorporated into chips on which other functions are implemented, e.g., processors (also referred to variously as microprocessors and central processing units ("CPUs")), they must perform at operating conditions as difficult as those that the processors must tolerate. In particular, SRAMs must perform within the same broad range of operating temperatures as processors and must be capable of tolerating fluctuations in supply voltages, e.g., noise disturbance, to the same extent as processors. Moreover, the sizes of SRAMs and SRAMs incorporated into chips having other functions are increasing. It is not uncommon for SRAMs to store many tens of millions of bits, even for SRAMs which are incorporated into other chips such as processors. In addition, to satisfy a growing demand for application specific integrated circuits ("ASICs"), it is desirable to provide SRAM macros ("macros" being functional modules) with large capacities capable of incorporation into multi-function chips, despite the scaling of the transistors and voltages used therein to unprecedented small sizes and values.

Storage cells in an SRAM or "SRAM cells" are arranged in an array of SRAM cells or "SRAM array." Wordlines ("WL") run in a direction of rows across an SRAM array. Bitlines run in a direction of columns across the SRAM array. Typically, one wordline WL is connected to each cell of a row of cells in the SRAM array. Typically, two bitlines carrying complementary signals are connected to each cell in a column of cells in the SRAM array, with one of the bitlines carrying a "true" signal representing the actual state of a bit signal and the other bitlines carrying a "complementary" signal representing an inverted version of the bit signal.

As the size of each cell within the SRAM array decreases with later generations of SRAMs, the threshold voltage of field effect transistors ("FETs") used in each cell is subject to increased variability. In addition, the voltage level at which power is supplied to the SRAM array is reduced or "scaled" with the introduction of new generations of SRAMs.

The increased variability of the threshold voltage of the FETs of cells of an SRAM and the reduced power supply voltage level make it harder to guarantee that certain margins of error are maintained during operation of the SRAM. Such margins of error have a direct bearing on the SRAM's ability to maintain the integrity of the data stored therein. Clearly, there is a requirement that an extremely miniscule amount of such errors occur during operation of an SRAM. The maximum tolerable error or upper limit for such error is often measured in terms of a number of "sigma", sigma representing the standard deviation in a distribution curve representing the occurrence of such errors. As currently manufactured, SRAMs can have many millions of cells per SRAM array, the upper limit typically is set at one or two errors per the SRAM array. Stated another way, the maximum tolerable rate of error is set at a level such as one or two parts per billion, for example. This translates approximately to 5.2 sigma.

Margins of error which need to be maintained in the SRAM include access disturb margin ("ADM") and write margin ("WRM"). The state of a bit stored in a cell of an SRAM is more likely to undergo a spontaneous inversion when the SRAM cell is partially selected. Access disturb margin (ADM) is a measure of the likelihood that the state of a bit stored in a partially selected cell of the SRAM array will spontaneously change from one state to another, e.g., flip from a "high" to a "low" state when a cell of the SRAM is accessed during a read or write operation. An unselected SRAM cell is "half" selected when a wordline connected to that cell has been activated. In other words, a cell is half selected when another cell connected to the same wordline is accessed for either a read or a write operation. Such "half" selected cells are more susceptible to disturbance during access to the cells within the SRAM because such cells are frequently subject to potential disturbance during such accesses at times when they are not being accessed.

Another margin of error that must be satisfied is the ability to write the state of bit to an SRAM cell, given the strength of the bitlines signals supplied to the SRAM cell and the time allotted to do so. Here, it is important that the SRAM cell have sufficient drive current to change from one stable state to another state under the influence of the bitlines signals supplied thereto. If the SRAM cell fails to be written with the bit that is provided thereto, data integrity is impacted. WRM pertains to the occurrence of this type of error. Here again, it is important to reduce this type of error to an extremely miniscule amount. WRM, like ADM is typically measured in terms of standard deviations or "sigma" from a center of a distribution of the occurrence of error. As in the above case, WRM should preferably be maintained at a high sigma number, preferably at a sigma value of about 5.2 or more.

The scaling of one or more voltages supplied to each SRAM cell of the SRAM array for each succeeding generation of SRAMs only increases the difficulty of achieving a desired ADM and desired WRM. Various approaches have been suggested for providing high ADM, despite the scaling of the voltages. Increasing the threshold voltage of each n-type FET ("NFET") and p-type FET or ("PFET") helps improve ADM. However, such approach potentially worsens WRM. In an SRAM, the available amount of drive current within each SRAM cell is already limited because of the scaling of the voltage. As a result, raising the threshold voltages of the NFET and PFET make the NFET weaker and the PFET stronger. While the SRAM cell becomes more stable under such conditions, writing each SRAM cell becomes more difficult than before.

Moreover, whether or not the threshold voltage of the NFETs is raised or that of the PFETs is lowered, ADM and WRM tend to respond differently to temperature. The sigma value of ADM tends to be higher at lower temperatures, e.g., when a chip containing an SRAM is first turned on or when the chip is running at lower frequency. On the other hand, the sigma value of ADM becomes lower with increasing temperature. On the other hand, the sigma value of WRM may be lower at lower temperatures, and the sigma value of the WRM may become higher with increasing temperature. As transistor sizes are scaled further downward in future generations of SRAMs, it becomes more difficult to achieve desirable sigma values on both ADM and WRM over the range of temperatures in which SRAMs (and processors which incorporate them) are required to operate.

Providing write schemes for SRAM cells having PFET passgates is one goal featured in commonly assigned U.S. Pat. No. 6,549,453 to Wong ("the '453 Patent"). In one scheme described in the '453 Patent, a voltage provided to a memory cell is adjusted from one level to another during a data writing operation to the memory cell. Circuits are provided by which a supply voltage provided to pull-up devices of the memory cell "floats down" to a lower level during the data writing operation. In addition, in one or more other schemes described therein, pull-down devices of the memory cell are disconnected from ground and allowed to "float up" to a voltage level higher than ground.

From the foregoing discussion, it is clear that new ways are needed to maintain high WRM and ADM in SRAMs despite further scaling of the transistors and voltages used in SRAM cells.

SUMMARY OF THE INVENTION

According to embodiments of the invention described herein, write margin within the SRAM is improved by lowering the power supply voltage provided to the column of SRAM cells to decrease the stability of those cells and thus make them easier to write to a different state. Preferably, embodiments of the invention herein are implemented in a layout pattern referred to as "thin cell layout" in which each column of the SRAM cells is served by a separate conductor carrying a power supply voltage. In a thin cell layout, power supply conductors run along the middle of columns of SRAM cells. In such case, the placement of the power supply conductors in the middle of columns of SRAM cells allows the power supply voltage to individual columns to be lowered while minimizing the effects upon cells in neighboring columns of the SRAM. In particular, the placement of power supply conductors in the middle of the columns reduces or minimizes the coupling of noise to the cells of neighboring columns due to changes in the levels of the voltage supplied to individual columns.

Embodiments of the invention described herein improve write margin without decreasing the stability of cells that are half-selected by an activated wordline. Therefore, such half-selected (wordline-selected) cells are kept from being made vulnerable to access disturbance.

In addition, in one or more of the embodiments described below, an NFET is used to actively pull down the power supply voltage from the nominal level Vdd to a lowered level Vdda, a process which in some instances can be made to occur faster than simply allowing the power supply voltage level to float down to a certain level. In addition, timing is preferably controlled so that the power supply voltage is reduced, and write values appear on the bitlines before the wordline is activated. In this way, maximum use is made of the limited duration duty cycle of the wordline. These things make it possible to scale the SRAM cell further while maintaining or increasing the sigma value. With higher sigma values of ADM and WRM, larger sizes of caches and buffers can be accommodated without increasing the likelihood that an error will occur.

In accordance with one or more embodiments of the invention, an SRAM is provided which includes NFETs as passgates of the cells therein. For the same size and similar processes used to manufacture NFETs and PFETs, NFETs produce higher on-current than PFETs. This occurs because of the higher mobility of electrons, the dominant charge carriers in NFETs, as compared to the mobility of holes, the dominant charge carriers in PFETs. Therefore, when the size of NFETs and PFETs and their manufacturing processes are about the same NFET passgates permit the SRAM cell to be written more quickly than PFET passgates. Thus, for the same size of an SRAM cell and the same ADM value, a higher WRM value is generally achieved using NFET passgates than when using PFET passgates. Conversely, for same WRM value and ADM value, smaller SRAM cell size can be achieved using NFET passgates than can be achieved using PFET passgates.

A static random access memory ("SRAM") includes a plurality of SRAM cells arranged in an array, the array including a plurality of rows and a plurality of columns. The SRAM further includes a plurality of bitlines, in which at least two bitlines correspond to each column of the plurality of columns of the array.

In one embodiment, a static random access memory ("SRAM") includes a plurality of SRAM cells arranged in an array, the array including a plurality of rows and a plurality of columns. A plurality of voltage control circuits correspond to respective ones of the plurality of columns of the array, each of the plurality of voltage control circuits being coupled to an output of a power supply. Each voltage control circuit has a function to temporarily reduce a power supply voltage provided to a plurality of SRAM cells belonging to a selected column of the SRAM. Such column is selected during a write operation in which a bit is written to one of the plurality of SRAM cells belonging to the selected column.

In one embodiment of the invention, the voltage control circuit includes a first p-type field effect transistor ("PFET") and a second PFET, the second PFET having gate and drain terminals tied together, and each voltage control circuit further includes an n-type field effect transistor ("NFET") having a conduction path coupled between the drain terminals of the first and second PFETs and ground.

In a particular embodiment, the voltage control circuit includes an n-type field effect transistor ("NFET") and a p-type field effect transistor ("PFET"), each of the NFET and the PFET having a conduction path connected to the output of the power supply.

In another embodiment, the voltage control circuit includes a first p-type field effect transistor ("PFET") and a second PFET, the second PFET having gate and drain terminals tied together.

DETAILED DESCRIPTION

Figure 1:
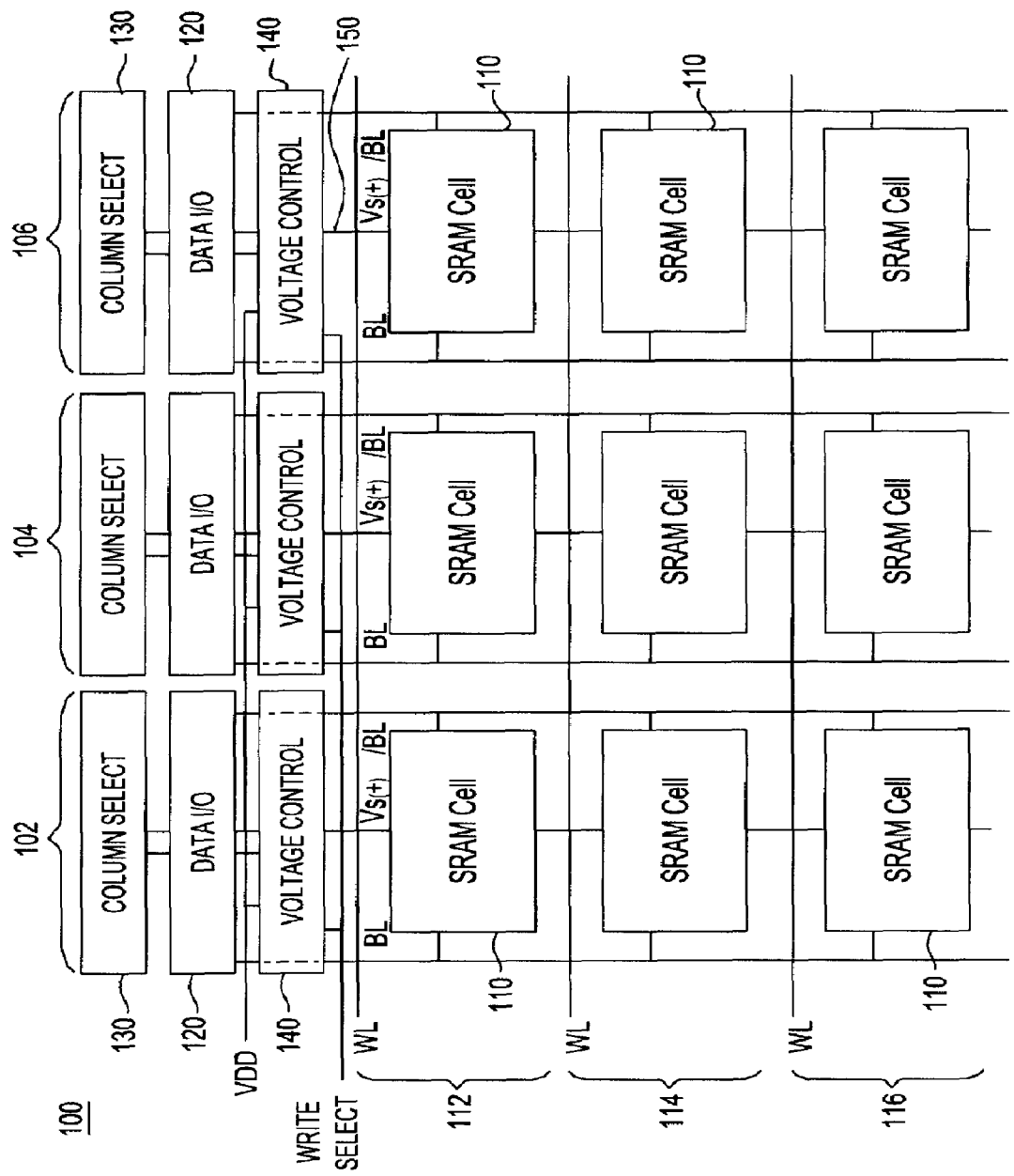
FIG. 1 is a block and schematic diagram illustrating an SRAM in accordance with an embodiment of the invention.

FIG. 1 is a block and schematic diagram illustrating an SRAM 100 in accordance with an embodiment of the invention. The SRAM 100 can be a stand-alone SRAM on a dedicated chip containing only one or more such SRAMs 100, or be incorporated into a chip having one or more additional functions, such as incorporated into a chip on which a processor or network interface is provided, for example.

As illustrated in FIG. 1, the SRAM includes a plurality of storage cells 110, each storage cell operable to store a data bit and to provide read access and write access thereto when power is supplied to the SRAM 100 during normal operation. The SRAM 100 typically includes many such cells, ranging from several thousand cells per SRAM to many millions of cells. Within the SRAM, storage cells are arranged in an array having a plurality of columns 102, 104, 106, etc., a plurality of rows 112, 114, 116, etc. For ease of illustration, only a few such cells 110 are shown.

The bitlines of the SRAM are arranged in a direction of the columns, two complementary bitlines BL and /BL being provided per each column of the array. One bitlines (BL) is a "true" bitlines which carries a signal representing the true or actual value of the data bit that is read from or written to one of the SRAM cells 110 coupled to that bitlines. The other bitlines (/BL) carries a signal representing the complement of the value of the data bit that is read from or written to one of the SRAM cells 110 coupled to that bitlines. The wordlines WL of the SRAM are arranged in a direction of the rows, one wordline being provided for each row. The wordlines WL operate to provide read and write access to cells coupled to each wordline in a row of the SRAM.

Greatly simplified, the reading of data to the SRAM and writing of data from the SRAM is performed by changing the voltage of the wordline WL from an inactive level to an active level to provide access a row of cells within the SRAM, e.g., row 112. Then, when the operation is to read data stored in the SRAM, a data bit stored in one of the cells of the accessed row is transmitted as a signal along the complementary pair of bitlines BL, /BL coupled to the cell to the data input output ("I/O") unit 120 coupled to the pair of bitlines. When the operation is to write data to the SRAM, a data bit is transmitted as a signal from the data I/O unit 120 in a direction of an accessed column of cells along the complementary pair of bitlines BL, /BL to one of the cells that also belongs to the row of cells accessed by the wordline WL.

During a read operation, when the signal arrives at the data I/O unit 120, it usually is a small swing signal having a value, e.g., 15 to 30 millivolts (mV) which varies little from when the signal is inactive to when it is active. Illustratively, a sense amplifier in the data I/O unit 120 amplifies the small swing signal arriving thereto from the accessed cell to a rail-to-rail signal, i.e., one which has either a normal high logic level or a normal low logic level. In CMOS technologies of interest at the time of this application, a rail-to-rail signal swings from a high logic level of about 1 volt to a low logic level of ground. However, the embodiments of the invention herein are usable in SRAMs which have smaller or larger rail-to-rail signal swings than the 1 volt to ground example of a signal swing that is discussed here. In addition, while the low logic level is frequently set at ground, SRAMs exist in which the low logic level is set at a voltage other than ground. Unless otherwise specified, it is intended by way of the examples and embodiments described herein not to limit the nominal high and low logic levels used within the SRAM to any particular voltages or ranges of voltage.

During a write operation, a particular column of the SRAM is selected to be written through column select circuitry 130, as driven by column addressing signals provided thereto (not shown). Prior to performing the write operation, the voltage levels on both bitlines BL and /BL are set to the high logic level. During the write operation, typically the voltage on one of the bitlines BL and /BL of a column is lowered from the high logic level to the low logic level. Typically, a data bit value of zero is represented by a voltage of ground and a data bit value of one is represented by the high logic level, being illustratively 1 volt. Thus, illustratively, when a data bit value of zero is to be written, the voltage on the true bitlines BL is lowered to ground. Conversely, when a data bit value of one is to be written, the voltage on the complementary bitlines /BL is lowered to ground. An operation to write the SRAM cell is thus a process driven by the ground voltage level on one of the pair of bitlines.

As further shown in FIG. 1, the SRAM includes a voltage control unit 140, preferably occurring at a rate of one unit per column. The voltage control unit 140 raises and lowers the power supply voltage Vs(t) to each SRAM cell within a particular column as a function of time to permit a cell belonging such column to be written more easily. The voltage control unit 140 controls the level of the power supply voltage Vs(t) between a nominal level Vdd and a lowered level Vdda. The nominal level Vdd is a level at which power is normally provided to cells within the SRAM during read operations and to columns within the SRAM whenever those columns are not being written to at a particular time. The lowered level Vdda is a level at which power is provided to cells in a particular column of the SRAM when a cell belonging to such column is being written. Ordinarily, the lowered level Vdda will above 50% of the Vdd level. As a boundary condition, the lowered level Vdda should be at least slightly higher than the threshold voltage level of the NFET transistor in a cell of the SRAM. Preferably, the lowered level Vdda is a level of about 70% to 80% of the nominal level Vdd. As an illustrative example, when Vdd is about 1 volt, the lowered level Vdda can be a level such as 0.7 volt. In an exemplary embodiment, Vdda is lower than Vdd by an amount equal to the threshold voltage of a transistor used to vary the power supply voltage Vs(t) between the two levels.

When the power supply voltage Vs(t) is at the nominal level Vdd, greater protection is provided against the possibility of access disturbance, the above-described problem of spontaneous change in a stored bit value. However, the temporary reduction in the power supply voltage Vs(t) to the lowered level Vdda permits a cell of the accessed column of SRAM cells to be written more easily. This increases one's ability to write to the SRAM and improves write margin within the SRAM.

As further shown in FIG. 1, preferably, each column of the SRAM cells is served by a separate conductor 150 carrying a power supply voltage in a layout pattern referred to as "thin cell layout." In such layout, power supply conductors run along the middle of columns of SRAM cells. The placement of the power supply conductors in the middle of columns of SRAM cells allows the power supply voltage to individual columns to be lowered while minimizing the effects upon cells in neighboring columns of the SRAM. In particular, the placement of power supply conductors in the middle of the columns reduces or minimizes the coupling of noise to the cells of neighboring columns due to changes in the levels of the voltage supplied to individual columns.

Figure 2:
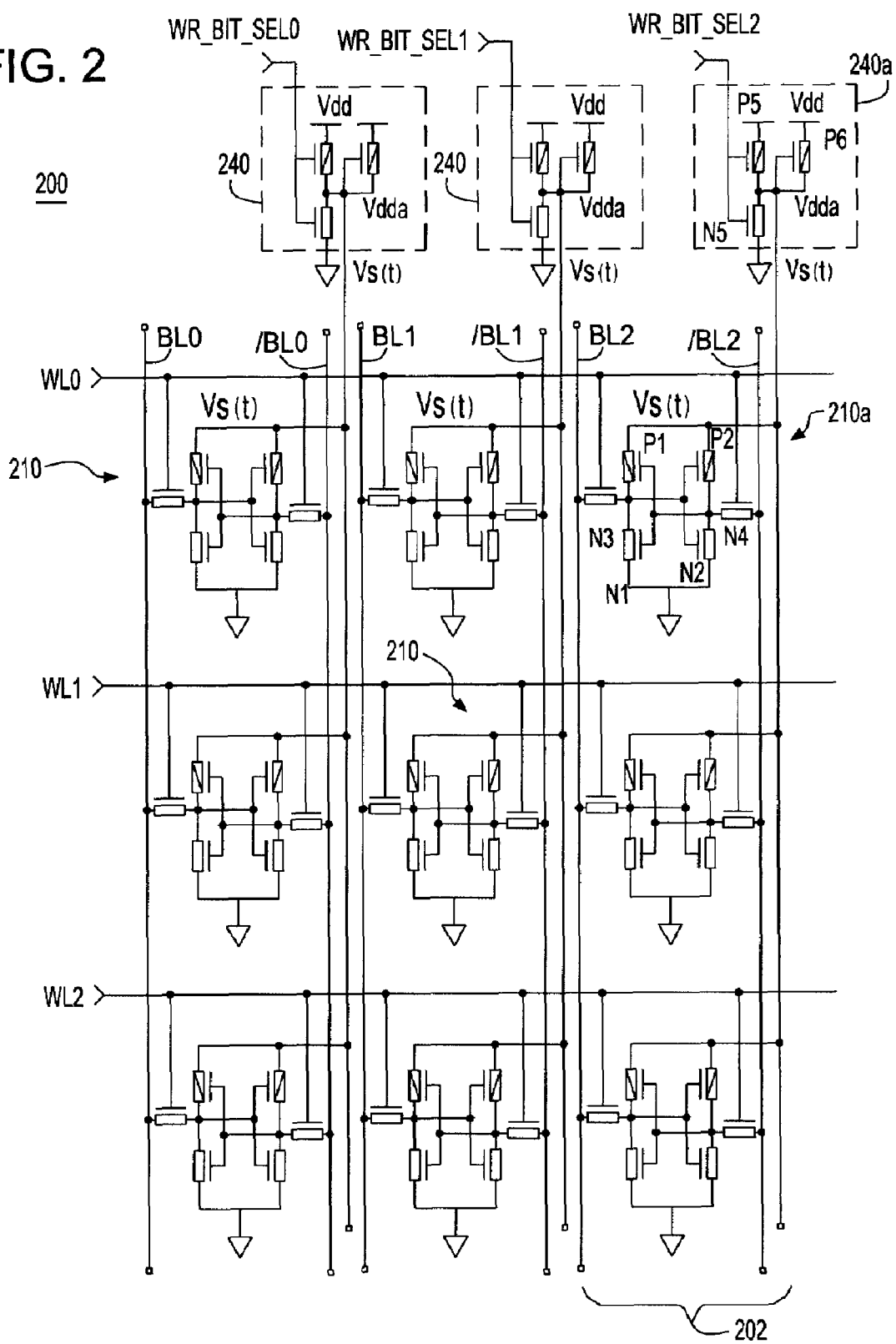
FIG. 2 is a schematic diagram further illustrating an SRAM in accordance with a particular embodiment of the invention.

FIG. 2 is a schematic diagram further illustrating an SRAM 200 according to a particular embodiment of the invention. The SRAM 200 is a particular example of the SRAM 100 described above with reference to FIG. 1 and operates in a manner like that of SRAM 100 described above. The structure and operation of SRAM 200 are described herein only to the extent as more particularly shown in FIG. 2 in relation to SRAM 100. As shown in FIG. 2, the SRAM 200 includes a plurality of individual storage cells 210. As above, only a few of the storage cells of the SRAM are shown in FIG. 2 for ease of illustration. Each storage cell, for example cell 210a, includes a latch and passgates. The latch includes a pair of cross-coupled inverters including a first inverter formed by PFET P1 and NFET N1, and a second inverter formed by PFET P2 and NFET N2. In each latch, the gate inputs of each inverter are connected to the common drain terminal of the other one of each inverter shown. In the particular example shown in FIG. 2, cell 210a and other cells 210 of the SRAM each include a pair of passgates implemented by NFETs N3 and N4.

Passgates N3 and N4 are activated by a high logic level voltage provided to the gate inputs of N3 and N4. When activated, the passgates N3 and N4 permit a bit to be read from or stored to a cell 210. Specifically, when activated, during a read operation the passgates couple bit signals from a cell 210 onto bitlines BL and /BL to be read by data I/O circuitry (FIG. 1). In addition, during a write operation, the passgates couple bit signals driven on bitlines BL and /BL by the data I/O circuitry to a cell 210 to write a data bit the cell 210.

The SRAM 200 further includes voltage control circuitry 240, preferably having a structure as shown particularly in FIG. 2. Preferably, the voltage control circuitry for each column of the SRAM 200 includes a first PFET P5, a second PFET P6 and an NFET N5. The gates of PFET P5 and NFET N5 are tied together and the drains of PFET P5 and NFET N5 are tied together as a common drain terminal. The gate and drain of PFET P6 are tied together so as to operate PFET P6 as a diode. The drain of PFET P6 is further tied to the common drain terminal of PFET P5 and NFET N5. A write bit select signal, e.g., signal WR_BIT_SEL2 is applied to the gates of PFET P5 and NFET N5.

Operation of the voltage control circuit 240 is as follows. During a read operation or during operation in which the SRAM is neither read from nor written to, the write bit select signals WR_BIT_SEL0, WR_BIT_SEL1, and WR_BIT_SEL2 are maintained at the low logic level, such as ground. One of these signals WR_BIT_SEL2 is applied to the gate of PFET P5 of the voltage control circuit 240a. This has the effect of fully turning on P5. At that time, the full power supply voltage level Vdd is passed through P5 from the power supply Vdd to the drain of P5. At such time, the full power supply voltage level Vdd also appears at the gate of PFET P6, such that P6 is turned off. In such case, the full power supply voltage level Vdd is passed through to cells of the column 202 served by the voltage control circuit 240a.

On the other hand, during a write operation, the write bit select signal WR_BIT_SEL2 to the voltage control circuit 240a is at a high logic level, having a high voltage signal above the threshold voltage of NFET N5. The high logic level of the write bit select signal is also above the threshold voltage of PFET P5, such that P5 is turned off at that time. At that time, NFET N5 and PFET P6 are also turned on. N5 functions as a pull-down device having an effect of quickly lowering the voltage at its drain from the Vdd level to a lower level. With the signal WR_BIT_SEL2 being high, P6 functions in a manner similar to a diode, producing a voltage drop approximately equivalent to its threshold voltage as a PFET.

The use of N5 as a pull-down device assures that the voltage control circuit 240a and other like voltage control circuits 240 transition the power supply voltage quickly when the voltage control circuit is selected by a write bit select signal at the high logic level. The pull-down device actively pulls down the power supply voltage Vs(t) present at the drain of N5 from Vdd to the lower Vdda level. In fact, in general, the circuit 240a transitions the power supply voltage from the nominal level Vdd to the lower level Vdda faster than in a circuit which has no such pull-down device connected to transistors P5 and P6. By lowering the power supply voltage Vs(t) quickly from Vdd to the lower level upon arrival of the WR_BIT_SEL2 signal, the circuit 240 applies the lower level of the power supply voltage Vs(t) at an earlier point in time to the cells of column 202. The lowered power supply voltage level Vs(t) and its early application to the cells of column 202 assure that a write operation to one of the cells along that column 202 is performed as early within the duty cycle of the write operation as possible.

Figure 3A:
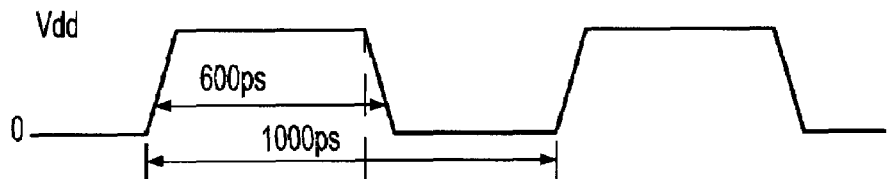
FIGS. 3(a) through 3(d) are timing diagrams illustrating operation of an SRAM in accordance with an embodiment of the invention.

FIGS. 3(a) through 3(d) are timing diagrams illustrating signals during a write operation to a cell 210a of an SRAM 200 according to the embodiment of the invention illustrated in FIG. 2. Signals are timed such that the power supply voltage Vs(t) is lowered to the accessed column prior to the activation of the wordline WL, thus assuring that conditions are at their most favorable for writing the cell beginning from the time that the wordline is activated. Some of the signals shown in FIGS. 3(a) through 3(d) transition at signal edges that coincide together, as described below. The time intervals shown in FIGS. 3(a) through 3(d) are illustrative of the duty cycles of the signals in relation to each other. In the illustrative example shown in FIGS. 3(a) through 3(d), the cycle time for performing one write access to the SRAM is 1000 picoseconds ("ps"), i.e., 1 nanosecond ("ns"), Operation of the SRAM in accordance will now be explained with reference to the signals shown in FIGS. 3(a) through 3(d). FIG. 3(a) illustrates a write bit select signal WR_BIT_SELn. This signal activates one of the voltage control circuits 240 shown in FIG. 2, for example, the voltage control circuit 240a to lower the power supply voltage Vs(t) to a selected column of the SRAM. This signal is also used to select and activate one bitlines (i.e., lower the voltage thereon to ground) of the pair of complementary bitlines of the selected column.

Figure 3B:
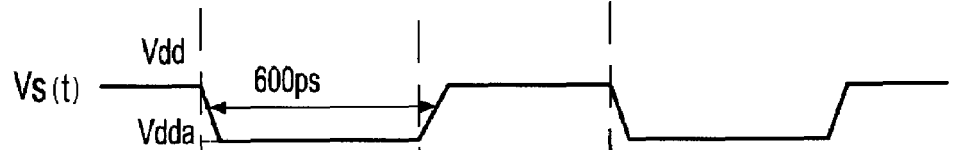

As seen in FIG. 3(b), the power supply voltage Vs(t) input to the column of SRAM cells falls from the higher steady-state level Vdd value to the lowered level Vdda in synchronism with the rise in the signal WR_BIT_SELn input to the voltage control circuit 240. At such time, NFET N5 of the voltage control circuit 240a (FIG. 2) actively pulls down the power supply voltage from Vdd to the lowered level Vdda, such level being determined by the threshold voltage of PFET P6 which is connected to function as a diode within the circuit 240a. In such manner, the power supply voltage Vs(t) readies the cell for writing when WR_BIT_SELn transitions from ground to the high Vdd level. In addition, referring to FIG. 3(c), in preparation for writing the data bit to the cell, the voltage level on one bitlines of the pair of bitlines BL, /BL is also lowered from Vdd to ground at or about the same time that WR_BIT_SELn rises from ground to Vdd.

After the foregoing transitions have occurred: i.e., WR_BIT_SELn having transitioned to the active state, e.g., from ground to Vdd, the bitlines signals adjusted to a value for writing a data bit to the cell, and the power supply voltage Vs(t) having been lowered to the lowered level Vdda, the wordline is activated. Conventionally, it is sought to increase the duty cycle of a wordline to be as long as possible within the cycle time for writing a data bit to a cell of the SRAM. This is done to allow time for signal current to flow between the cell through passgates of the cell to or from the bitlines, causing the latch of the cell to flip from one state to the other.

However, the state of a data bit stored in one cell of the SRAM cannot change until other conditions favor its immediate change. Here, conditions are not at their most favorable for changing the state of a bit stored in the SRAM until the power supply voltage level Vs(t) has fallen to the lowered level Vdda from the nominal level. In recognition thereof, in the embodiment of the invention illustrated in FIGS. 2 and 3(a) through 3(d), the duty cycle of the WR_BIT_SELn, the lowered voltage level Vdda, and the bitlines write values are extended as long as possible. Then, the wordline is activated at the earliest time at which the foregoing signals can be considered to reach stable states following their transitions. In the particular example shown in FIGS. 3(a) through 3(d), the wordline is activated at a time of approximately 50 to 100 ps later, i.e., at a point in time which is approximately 5 to 10% of the cycle time later than the time at which the power supply voltage level Vs(t) and the bitlines begin to transition to their write values. In such manner, the wordline is activated at a time when it is most favorable to write a new data bit value to the accessed cell.

After the wordline is activated, it remains active for a period of time such as 500 ps, such duty cycle preferably being the maximum duty cycle permitted within the period of one writing cycle of the SRAM. In addition, such duty cycle is selected to assure that the power supply voltage Vs(t) has reached the lowered level Vdd and the signals on the bitlines are stable or at least near stable state. After the wordline is activated, current flows through the passgates of the cell between the cell and the bitlines coupled to the cell. Depending upon the value of the bit that was last previously stored in the cell and the value of the data bit being written, the state of the SRAM either stays the same or flips from the one state to the other state, i.e., from zero to one, or from one to zero.

Figure 3C:
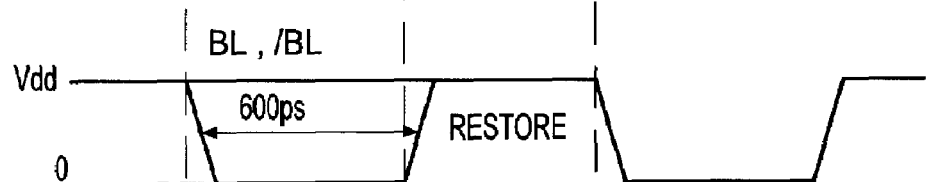
Figure 3D:
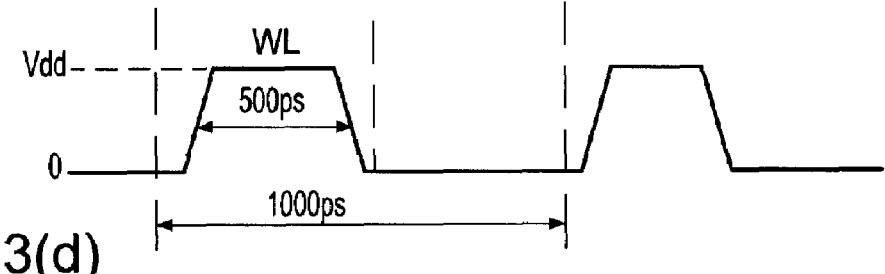

Thereafter, the after the bit has been written to the cell, the wordline is deactivated again. The write bit select signal WR_BIT_SELn returns to ground and the bitlines signals are both restored to Vdd. The power supply voltage Vs(t) also returns to Vdd. Referring to FIG. 3(c), a precharge/restore interval ("RESTORE") then occurs.

Following the precharge/restore interval, when a cell is selected to be written again, a write bit select signal WR_BIT_SELn for the selected column is activated again, at which time the operations of lowering the power supply voltage Vs(t), lowering the voltage on one of the bitlines to a column occur, after which a wordline for a selected row is activated to write the data bit to the selected cell.

In a variation of the embodiment described with reference to FIGS. 3(a) through 3(d), logic circuitry may be employed to enhance the reliability of writing to cells of the SRAM when the SRAM is to be written continuously with data for a period of time extending over a plurality of cycles. As an example thereof, when data is to be written to a defined subset of the columns of the SRAM, WR_BIT_SELn is raised from ground to Vdd for the subset of columns and the power supply voltage Vs(t) is lowered for that subset of columns such that each of the columns is ready and primed to be written at that time. These signals are then left steady, unchanging at these active states for the whole time and for the number of cycles in which writing is performed continuously to the SRAM. Signals on bitlines are then altered in each cycle to write values, but only for the columns of the SRAM that are being written in each cycle. Corresponding wordlines of the SRAM are also activated in each cycle for the cells to be written in each cycle. Here, by leaving the write bit select signals and power supply voltages Vs(t) steady that are provided to each of many columns being written over a series of cycles, the power supply voltage has a greater measure of stability at the lowered level to such columns. In addition, a savings in current can be achieved for SRAMs in which the same column is accessed during multiple cycles having avoided transitioning the power supply voltage Vs(t) line to each column two or more times during the period that the SRAM is continuously written.

Figure 4:
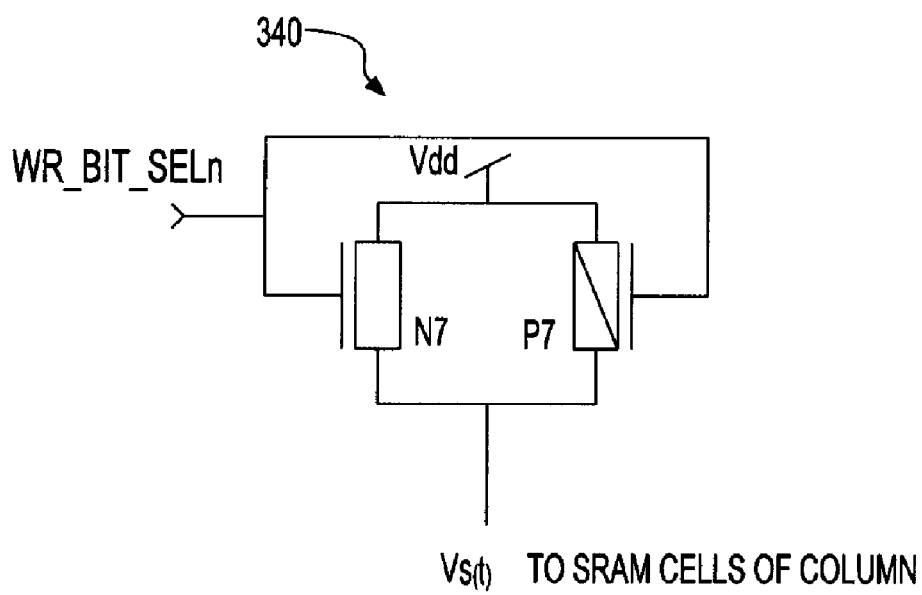
FIG. 4 is a schematic diagram illustrating an alternative voltage control circuit in accordance with a variation of the embodiment illustrated in FIG. 1.

FIG. 4 illustrates a variation of the embodiment described above with reference to FIG. 2. As shown in FIG. 4, the voltage control circuit 340 includes an NFET N7 and PFET P7 connected in parallel, having an upper conductive terminal in which the drain of N7 and the source of P7 are connected directly to Vdd. The voltage control circuit 340 also has a lower conductive terminal connected to the source of N7 and the drain of P7 as the power supply voltage Vs(t) output from the voltage control circuit, such voltage being supplied to cells of a column of the SRAM. The write bit select signal WR_BIT_SELn is supplied in parallel to the gates of NFET N7 and PFET P7. In operation, when WR_BIT_SELn is at the deselected state of ground, N7 is turned off and P7 is turned on. At another time, when WR_BIT_SELn is at the selected state of Vdd, N7 is turned on and P7 is turned off. At such time, the lowered level Vdda of the power supply voltage Vs(t) is lower than the nominal level Vdd by the value of the threshold voltage of NFET N7.

Figure 5:
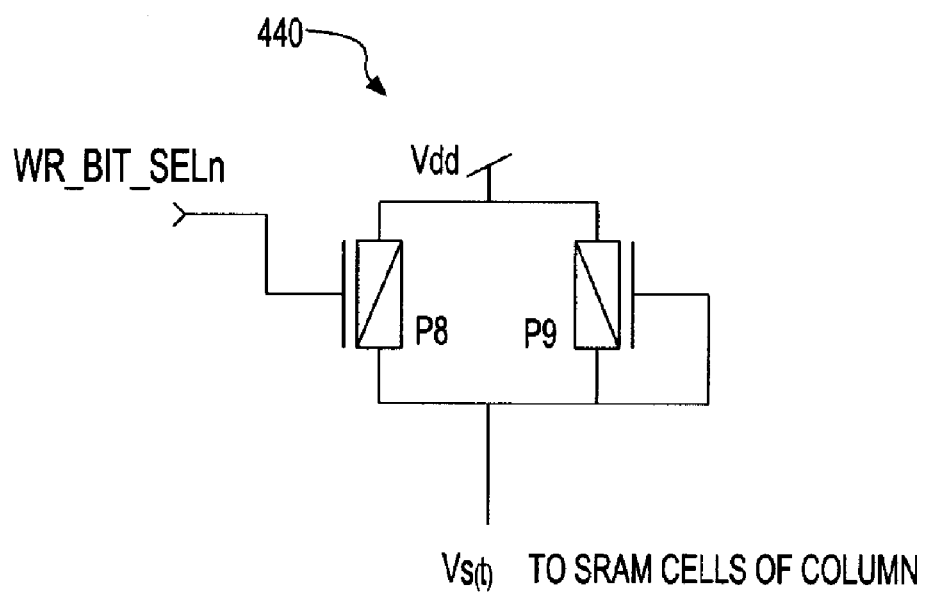
FIG. 5 is a schematic diagram illustrating a further alternative voltage control circuit in accordance with another variation of the embodiment illustrated in FIG. 1.

FIG. 5 illustrates another variation of the embodiment described above with reference to FIG. 2. As shown in FIG. 5, the voltage control circuit 440 includes a first PFET P8 and a second PFET P9 connected in parallel, in which the sources of P8 and P9 are connected directly to Vdd. The voltage control circuit 440 also has a lower conductive terminal connected to the drains of P8 and P9 as the power supply voltage Vs(t) output from the voltage control circuit, such voltage being supplied to cells of a column of the SRAM. In circuit 440, the write bit select signal WR_BIT_SELn is supplied to the gate of PFET P8. The gate of PFET P9 is connected to its drain such that P9 operates as a diode when it is biased in a turned on state. In operation, when WR_BIT_SELn is at the deselected state of ground, P8 is turned on and P9 is biased in the off state such that Vdd is passed through P8 as the power supply voltage Vs(t). At another time, when WR_BIT_SELn is at the selected state of Vdd, P8 is turned off. At that time P9 is turned on but operates as a diode such that the voltage at the drain of P9 is lower than Vdd by the threshold voltage of P9. At such time, the power supply voltage Vs(t) has the lowered level Vdda, lower than the nominal level Vdd by the value of the threshold voltage of P9.

By the foregoing embodiments, ways are provided to improve write margin (WRM) within an SRAM or other like memory without adversely affecting access disturb margin (ADM). Moreover, ways are provided to lower the power supply voltage to cells of the SRAM and then time the activation of the wordline for the greatest success in writing the SRAM within the limited cycle time of the SRAM.

While the invention has been described in accordance with certain preferred embodiments thereof, many modifications and enhancements can be made thereto without departing from the true scope and spirit of the invention, which is limited only by the claims appended below.

What is claimed is:

1. A static random access memory ("SRAM"), comprising:
   a plurality of SRAM cells arranged in an array, said array including a plurality of rows and a plurality of columns; and
   a plurality of voltage control circuits corresponding to respective ones of said plurality of columns of said array, each of said plurality of voltage control circuits coupled to an output of a power supply, each said voltage control circuit being operable to temporarily reduce a voltage provided to power supply inputs of a plurality of SRAM cells belonging to a selected column of said plurality of columns, said selected column being selected during a write operation in which a bit is written to one of said plurality of SRAM cells belonging to said selected column, wherein each said voltage control circuit includes an n-type field effect transistor ("NFET") and a p-type field effect transistor ("PFET"), each of said NFET and said PFET having a conduction path connected between the output of the power supply and said power supply inputs of said plurality of SRAM cells.

2. The SRAM as claimed in claim 1, further comprising a plurality of power supply conductors, each running along a middle of a respective one of said plurality of columns of said array, each of said plurality of power supply conductors connecting one of said plurality of voltage control circuits to said power supply inputs of said plurality of cells of an individual one of said plurality of columns.

3. The SRAM as claimed in claim 1, wherein, when data is written to one or more of the plurality of SRAM cells belonging to said selected column during each of a plurality of succeeding cycles, the voltage control circuit corresponding to said selected column is operable to maintain the reduced voltage continuously over the plurality of succeeding cycles.

4. A method of controlling a voltage level supplied to a static random access memory ("SRAM"), comprising:
   supplying a voltage to a plurality of SRAM cells of the SRAM at a first voltage level unless the plurality of SRAM cells belong to a column of a plurality of columns of the SRAM which is selected for a write operation;
   selecting a first column of the plurality of columns for a write operation;
   operating a first p-type field effect transistor ("PFET") and a second PFET to supply the voltage at a second voltage level lower than the first voltage level to a plurality of SRAM cells belonging to the first column, each of the first and second PFETs having a conduction path connected between a power supply and power supply inputs of the plurality of SRAM cells;
   while continuing to supply the voltage at the second voltage level, writing a bit to one of the plurality of SRAM cells belonging to the first column during a first write cycle;
   when the first column is no longer selected for write operations, operating the first and second PFETs to supply the voltage at the first voltage level to the plurality of SRAM cells belonging to the first column.

5. The method as claimed in claim 4, wherein the voltage supplied to the plurality of SRAM cells is supplied to power supply inputs of the plurality of SRAM cells.

6. The method as claimed in claim 5, wherein the second voltage level is lower than the first voltage level by an amount equal to a threshold voltage of a field effect transistor ("FET").

7. The method as claimed in claim 5, wherein the second voltage level is lower than the first voltage level by an amount equal to the threshold voltage of an n-type FET ("NFET").

8. The method as claimed in claim 5, wherein the second voltage level is lower than the first voltage level by an amount equal to the threshold voltage of a p-type FET ("PFET").

9. The method as claimed in claim 5, wherein the plurality of SRAM cells include passgates, the passgates including NFETs.

10. The method as claimed in claim 5, wherein the voltage supplied to the plurality of SRAM cells is lowered to the second voltage at a first point in time and a wordline connected to an accessed one of the plurality of SRAM cells is activated at a second point in time later than the first point in time, the data bit being written to the accessed one of the plurality of SRAM cells after the second point in time.

11. The method as claimed in claim 4, wherein the firs and second PFETs have drain terminal coupled to the power supply inputs of the plurality of SRAM cells, wherein the step of operating the first and second PFETs to supply the voltage at the second level includes operating an n-type field effect transistor ("NFET") having a conduction path coupled to the drain terminals of the first and second PFETs to actively pull down the voltage at the power supply inputs of the plurality of SRAM cells.

12. A static random access memory ("SRAM"), comprising
   a plurality of cells arranged in an SRAM having a plurality of columns; and
   a voltage control circuit operable to temporarily reduce a voltage provided to power supply inputs of cells belonging to a selected column of said SRAM, said selected column being selected during a write operation in which a bit is written to one of said cells belonging to said selected column, wherein said voltage control circuit includes a first p-type filed effect transistor ("PFET") and a second PFET, each of said first and second PFETs having a conduction path connected between a power supply and said power supply inputs of said cells belonging to said selected column.

13. An SRAM as claimed in claim 12, wherein gate and drain terminals of said second PFET are tied together.

14. The SRAM as claimed in claim 12, wherein said voltage control circuitry further includes an n-type field effect transistor ("NFET") having a conduction path coupled to said drain terminals of said first and second PFETs for actively pulling down said voltage supplied to said cells belonging to said selected column.

15. A method of controlling a voltage level supplied to a static random access memory ("SRAM"), comprising:
   supplying a voltage to cells of the SRAM at a first voltage level, the SRAM having a plurality of columns;
   selecting a column of the plurality of columns for a write operation;

operating an n-type field effect transistor ("NFET") and a p-type field effect transistor ("PFET") to supply the voltage at a second voltage level lower than the first voltage level to cells of the SRAM belonging to the selected column, each of the NFET and PFET having a conduction path connected between an output of a power supply and a power supply input of the plurality of SRAM cells;

while continuing to supply the voltage at the second voltage level, writing a bit to one of the cells belonging to the selected column; and thereafter operating the NFET and the PFET to supply the voltage to the cells belonging to the selected column at the first voltage level again.

* * * * *